United States Patent [19]

Todd et al.

[11] Patent Number: 5,539,237
[45] Date of Patent: Jul. 23, 1996

[54] SCHOTTKY DIODE WITH GUARD RING

[75] Inventors: James R. Todd; Joe R. Trogolo, both of Plano; Andrew Marshall; Eric G. Soenen, both of Dallas, all of Tex.

[73] Assignee: Texas Instruments Incorporated, Dallas, Tex.

[21] Appl. No.: 432,732

[22] Filed: May 2, 1995

Related U.S. Application Data

[62] Division of Ser. No. 6,911, Jan. 21, 1993, Pat. No. 5,418,185.

[51] Int. Cl.$^6$ ............................. H01L 29/47; H01L 31/07
[52] U.S. Cl. ............................. 257/484; 257/476; 257/483
[58] Field of Search ............................. 257/484, 486, 257/476, 483

[56] References Cited

U.S. PATENT DOCUMENTS

| | | | |
|---|---|---|---|
| 4,607,270 | 8/1986 | Iesaka | 257/484 |
| 4,862,244 | 8/1989 | Yamagishi | 257/484 |
| 4,874,714 | 10/1989 | Eklund | 437/39 |

FOREIGN PATENT DOCUMENTS

| | | | |
|---|---|---|---|
| 275179 | 7/1988 | European Pat. Off. . | |
| 58-033876 | 2/1983 | Japan . | |
| 59-135779 | 8/1984 | Japan . | |
| 60-020585 | 2/1985 | Japan . | |
| 61-228669 | 10/1986 | Japan . | |
| 0005842 | 1/1994 | Japan | 257/484 |

*Primary Examiner*—Robert P. Limanek
*Assistant Examiner*—David B. Hardy
*Attorney, Agent, or Firm*—Alan K. Stewart; Richard L. Donaldson; William E. Hiller

[57] ABSTRACT

A Schottky diode circuit 20 is formed on a semiconductor layer 24. A conductive contact 36 on the surface of the semiconductor layer 24 forms a Schottky barrier 40 at the junction of the conductive contact 36 and the semiconductor layer 24. A guard ring 26 in the semiconductor layer 24 is adjacent to the Schottky barrier 40 and is separated from the conductive contact 36 by a portion of the semiconductor layer 24. No direct electrical path exists between the guard ring 26 and the conductive contact 36.

6 Claims, 4 Drawing Sheets

5,539,237

SCHOTTKY DIODE WITH GUARD RING

This is a Divisional of application Ser. No. 08/006,911 Method of Making Schottky Diode with Guard Ring filed Jan. 21, 1993, now U.S. Pat. No. 5,418,185.

FIELD OF THE INVENTION

This invention generally relates to electronic semiconductor devices and fabrication methods. More specifically, the invention relates to Schottky barrier diodes.

BACKGROUND OF THE INVENTION

Schottky diodes have several useful features and characteristics. When incorporated into integrated circuit (IC) technologies the Schottky diode enhances the range of diodes available. Typically, a Schottky diode consists of a metal layer connected to a doped semiconductor layer. The Schottky barrier is formed at the juncture of the metal and the semiconductor. Due to radius of curvature effects at the edges of the Schottky barrier, a field quickly builds up when a reverse bias is applied. This leads to a low breakdown voltage and poor leakage characteristics.

Breakdown voltage has traditionally been improved by placing a diffused p-type guard ring around the Schottky barrier, with the p guard ring short-circuited to the anode (metal plate) of the Schottky. This relieves the field, giving rise to a higher reverse voltage breakdown.

SUMMARY OF THE INVENTION

It has been discovered that the guard ring also introduces an undesirable parasitic device, which under high forward current conditions through the Schottky diode can cause current leakage. This can severely impact the correct operation of the circuit.

Generally, and in one form of the invention, a Schottky diode having a guard ring with reduced parasitic effects is provided. The Schottky diode circuit is built on a semiconductor layer. A conductive contact on the surface of the semiconductor layer forms a Schottky barrier at the junction of the conductive contact and the semiconductor layer. A guard ring in the semiconductor layer is adjacent the Schottky barrier and is separated from the conductive contact by a portion of the semiconductor layer. No direct electrical path exists between the guard ring and the conductive contact.

An advantage of the invention is that the guard ring is separated from the conductive contact (anode) by a portion of the semiconductor layer. This separation reduces the effects of the undesirable parasitic device which is formed between the guard ring and the semiconductor layer. This creates a Schottky diode with a higher breakdown voltage and improved leakage characteristics.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
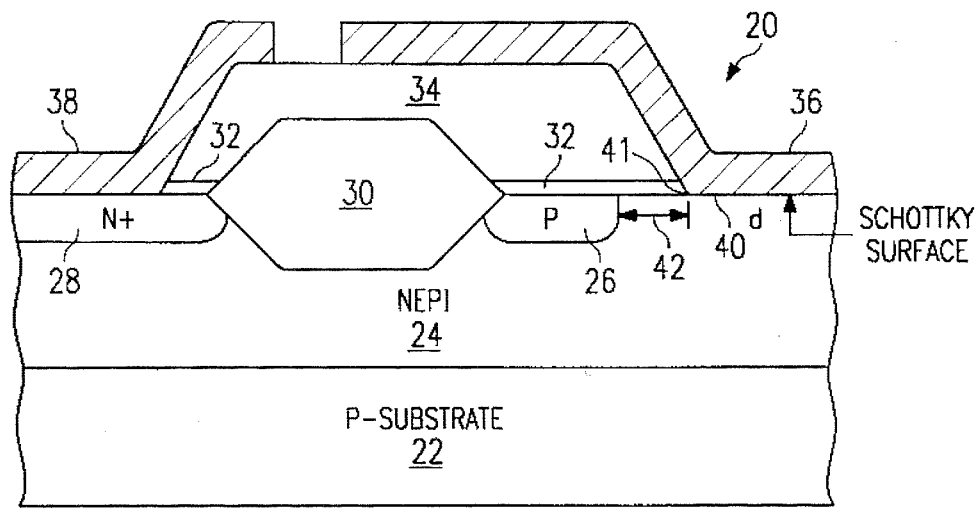
FIGS. 1 through 5 are cross-sectional views showing a first preferred embodiment of the present invention in various states of fabrication, according to the processing steps of the invention.

FIGS. 1–5 are cross-sectional diagrams showing a first preferred embodiment of the present invention and a method for forming the same. In FIGS. 1 through 5, a Schottky diode with a P guard ring 26 for improved breakdown voltage is formed. The circuit 20, shown in FIG. 1, is the completed structure of the first preferred embodiment. The circuit 20 contains P semiconductor substrate 22, semiconductor layer 24 (N epitaxial layer), P guard ring 26, N+ doped region 28, field insulator 30, insulator layer 32, patterned insulator 34, conductive contact 36, and conductive contact 38.

A Schottky barrier 40 is formed between N epitaxial layer 24 and conductive contact 36. A P guard ring 26 is formed in N epitaxial layer 24. P guard ring 26 is separated from the Schottky barrier 40 by a distance 42. The distance 42 is optimized to allow optimum performance of the Schottky barrier 40. P guard ring 26 reduces the electric field at the corner 41 of the conductive contact 36 which reduces the radius of curvature effects at the edges of the Schottky barrier 40. This increases the breakdown voltage and improves leakage characteristics of the Schottky barrier 40.

One of the advantages of this first preferred embodiment is that the P guard ring 26 is separated from the conductive contact 36 by a distance 42. This separation reduces the effects of the undesirable parasitic vertical PNP device which is formed between the P guard ring 26, N epitaxial layer 24, and the P-substrate 22. Another advantage of this embodiment is that the P guard ring 26 has no electrical connection to the conductive contact 36 other than through the N epitaxial layer 24. This creates a floating P guard ring 26 which further reduces the effect of the parasitic PNP.

Further features and characteristics of the invention will be apparent from consideration of a preferred embodiment method of fabrication. The method of fabrication includes the following steps which are illustrated in cross sectional elevation views in FIGS. 1 through 5.

Figure 2:
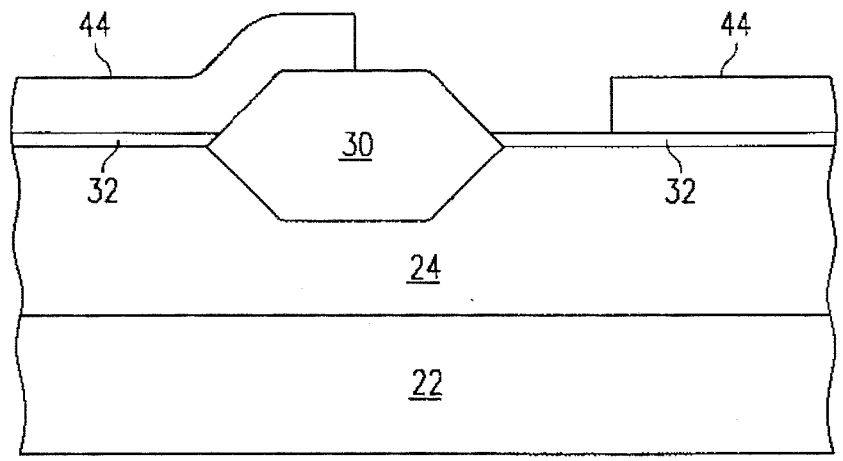

Referring to FIGS. 2 through 5, a method of forming the preferred embodiment of FIG. 1 is described in detail. FIG. 2 illustrates, in cross-section, a partially fabricated circuit formed into an N epitaxial layer 24 over a P substrate 22. N epitaxial layer 24 is grown on P substrate 22 according to well known techniques. A field insulator 30, such as a field oxide, is then formed in the surface of the N epitaxial layer 24. After the field insulator 30 is formed, insulator layer 32 is frowned on the surface of N epitaxial layer 24. Insulator layer 32 may be formed according to any one of a member of well-known techniques. For example, insulator layer 32 may be a grown silicon oxide. A photoresist 44 is then deposited and patterned to expose the surface of insulator layer 32 for the formation of P guard ring 26. A dopant such as boron (e.g. 1 E13 ions/cm$^2$ at 40 KeV) is implanted into N epitaxial layer 24 through the exposed insulator layer 32 to form P guard ring 26, shown in FIG. 3. The photoresist 44 is then removed.

Figure 3:
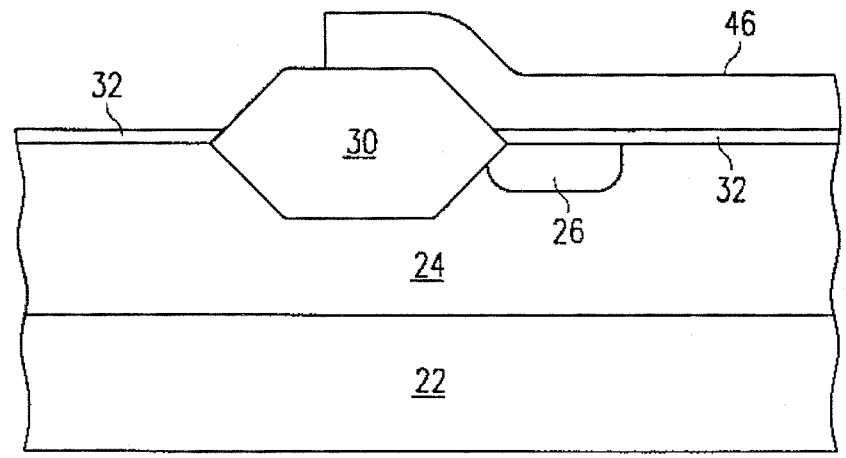
Figure 4:
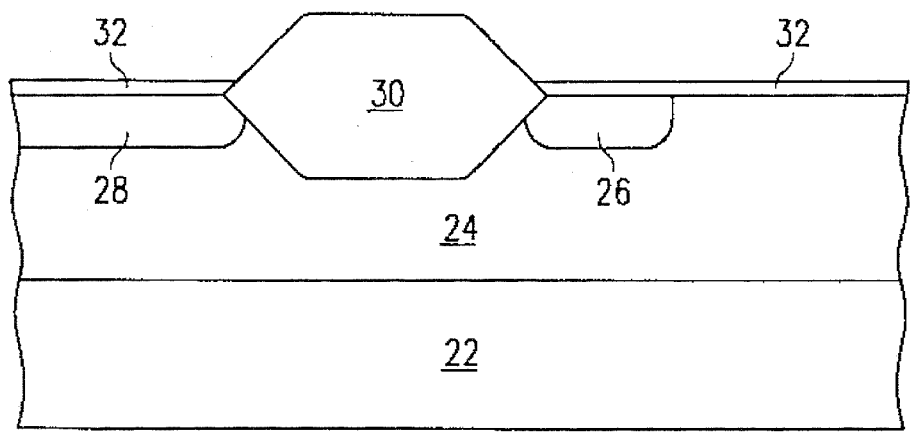

Next, a photoresist 46 is deposited and patterned to expose the surface of insulator layer 32 for the formation of N+ doped region 28, as shown in FIG. 3. Then a dopant such as antimony (e.g. 1 E15 ions/cm$^2$ at 120 KeV) or arsenic (e.g. 1 E15 ions/cm$^2$ at 135 KeV) is implanted through the exposed insulator layer 32 to form N+ doped region 28. After the N+ doped region 28 is formed, the photoresist 46 is stripped, leaving the structure shown in FIG. 4.

Figure 5:
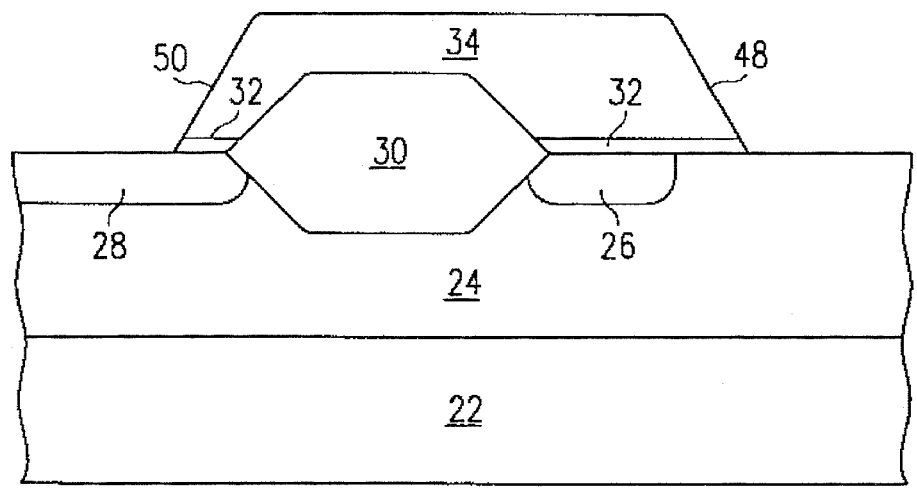

Then a patterned insulator 34 consisting of borophososilicate glass is formed over the field insulator 30 and over the insulator layer 32. The borophososilicate glass (BPSG) is deposited by chemical vapor deposition (CVD). The BPSG is reflowed to smooth out any sharp edges. The BPSG is then patterned and anisotropically etched to produce patterned insulator 34 with angled sides 48 and 50, as shown in FIG. 5. The portion of the insulator layer 32 not underlying the patterned insulator 34 is also etched away, as shown in FIG. 5.

A metal layer is deposited on the patterned insulator 34 and on the N epitaxial layer 24. The metal layer is then patterned and etched to provide conductive contacts 36 and 38, shown in FIG. 1. Conductive contact 36 forms the anode of the Schottky diode and conductive contact 38 form the cathode of the Schottky diode.

Figure 6:
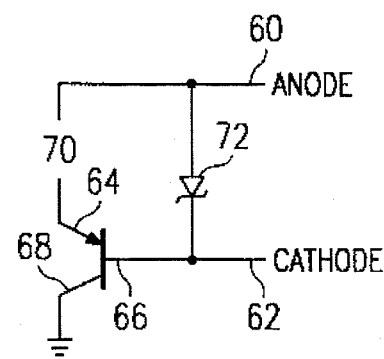
FIG. 6 is a circuit diagram of the structure in FIG. 1.

FIG. 6 is an electrical diagram of the circuit in FIG. 1. The anode 60 is equivalent to the conductive contact 36. The cathode 62 is equivalent to the conductive contact 38. The emitter 64 is equivalent to the P guard ring 26. The base 66 is equivalent to the N epitaxial layer 24. The collector 68 is equivalent to the P substrate 22. The open circuit 70 between the anode 60 and the emitter 64 is representative of the floating P guard ring 26. The diode 72 is representative of the Schottky barrier 40.

FIG. 1 shows a Schottky diode with a P guard ring 26. The P guard ring 26 is not connected to the conductive contact 36 either directly or through a resistor. The only electrical path from the conductive contact 36 to the P guard ring 26 is through the N epitaxial layer 24. This floating P guard ring 26 is demonstrated by the open circuit 70 shown in the electrical diagram in FIG. 6.

The floating P guard ring 24 gives the advantage of increased breakdown voltage while minimizing the effect of the parasitic PNP transistor created by the P guard ring (emitter) 26, N epitaxial layer (base) 24, and P substrate (collector) 22. During reverse bias operation the depletion region extends from the Schottky barrier 40 at the surface of the N epitaxial layer 24. The depletion region reaches through to the floating P guard ring 26 at an applied voltage lower than the breakdown voltage of the Schottky diode without a guard ring. A further increase in the applied reverse bias causes the floating P guard ring 26 to deplete into the N epitaxial layer 24 and shield the edge 41 of the Schottky barrier 40 from high field effects around the periphery.

The effect of the distance 42 is to control the voltage at which the Schottky barrier depletion region reaches through and to optimize the shielding around the Schottky barrier 40. The floating P guard ring 26 does not have a significant adverse effect on the forward bias operation of the diode because, under forward bias conditions, the floating P guard ring 26 does not inject minority carriers.

The embodiment described above achieves the implementation of high voltage Schottky diodes while preventing the injection of minority carriers into the N epitaxial layer 24 during forward bias. This injection of minority carriers can create undesirable gain in the parasitic PNP transistor created by the P guard ring (emitter) 26, N epitaxial layer (base) 24, and P substrate (collector) 22. This method avoids the need for Schottky device isolation by the use of deep N+ and N+ buried layers which act to contain minority carrier injection.

Figure 7:
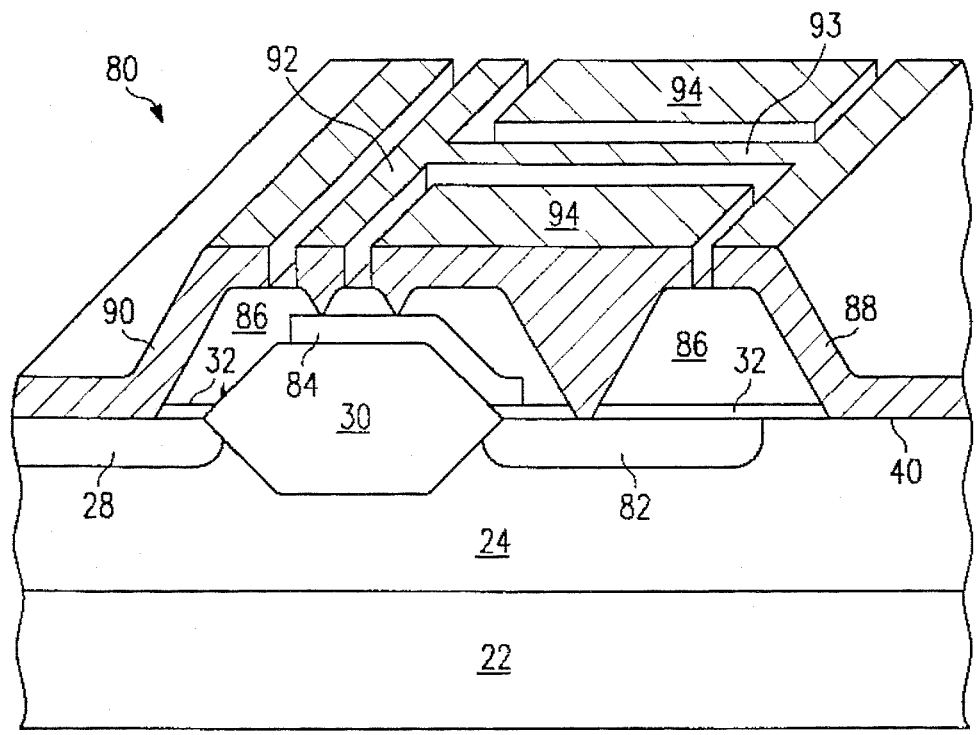
FIG. 7 is a perspective view of a second preferred embodiment of the present invention.

FIG. 7 is a perspective diagram showing a second preferred embodiment of the present invention. FIGS. 8 through 11 are cross-sectional diagrams showing a method for forming the second preferred embodiment shown in FIG. 7. Like numbers refer to like parts where possible. Referring to FIG. 7, a diagram of a Schottky diode with a P guard ring 82 connected to a resistive polysilicon layer 84 is shown. The circuit 80, shown in FIG. 7, contains P substrate 22, N epitaxial layer 24, P guard ring 82, N+ doped region 28, field insulator 30, insulator layer 32, resistive polysilicon layer 84, patterned insulator 86, conductive contact 88, conductive contact 90, conductive contact 92, conductive contact 94, and conductive extension 93.

Figure 8:
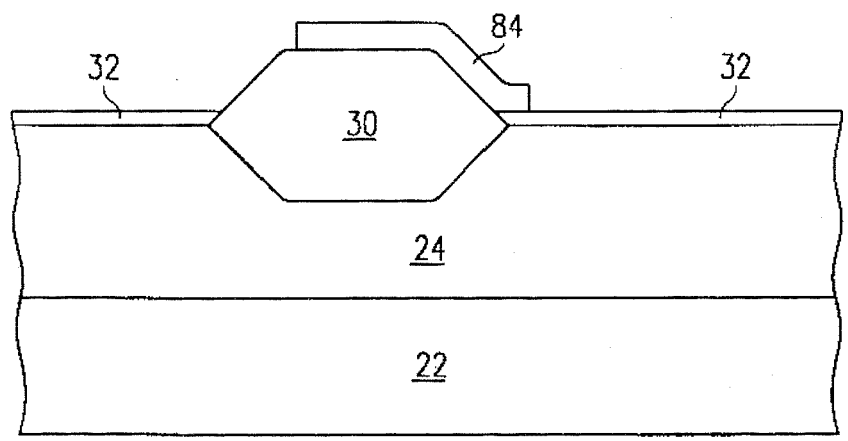
FIGS. 8 through 11 are cross-sectional views of various states of fabrication of the second preferred embodiment of FIG. 7, according to the processing steps of the invention.

Referring to FIGS. 8 through 11, a method of forming the second preferred embodiment of FIG. 7 is described in detail. FIG. 8 illustrates, in cross-section, a partially fabricated circuit wherein the P substrate 22, N epitaxial layer 24, and insulator layer 32 are formed according to the method described above for the first preferred embodiment. A resistive polysilicon layer 84 is deposited over the surface of the field insulator 30 and the insulator layer 32. FIG. 8 shows the polysilicon layer 84 after being patterned and etched for the formation of the polysilicon resistor. The polysilicon layer 84 also overlies a portion of the insulator layer 32 for alignment of the P guard ring 82.

Figure 9:
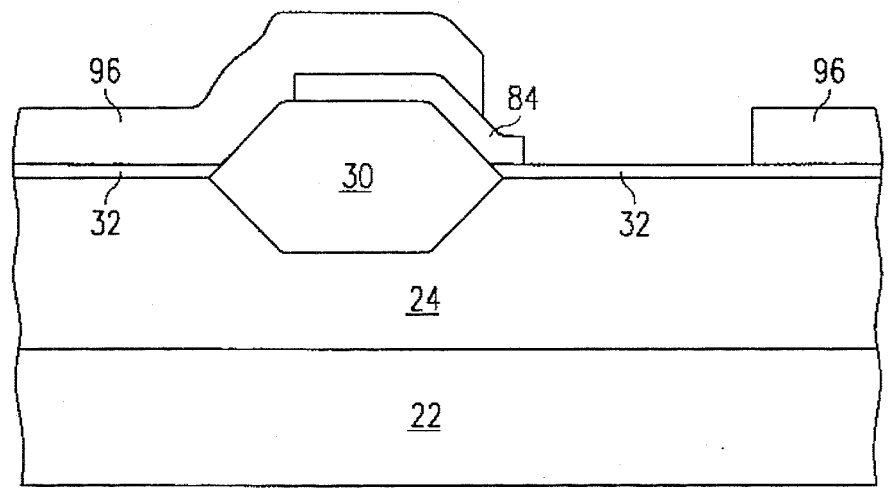
Figure 10:
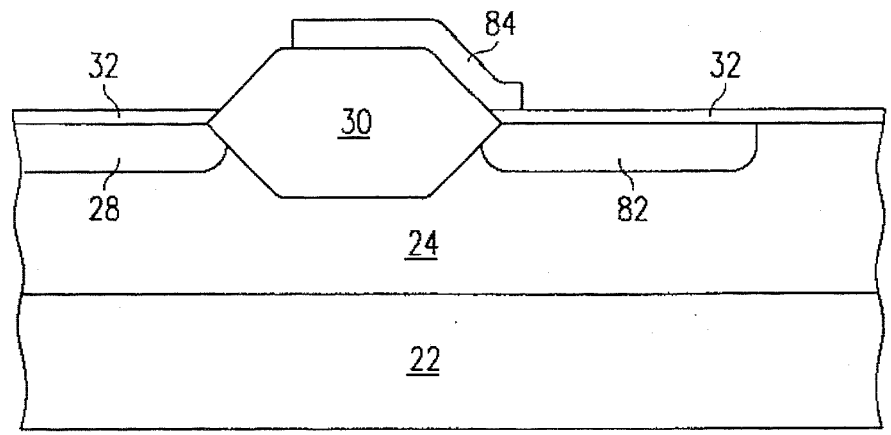

A photoresist 96 is then deposited and patterned to expose the surface of insulator layer 32 for the formation of P guard ring 82. A portion of polysilicon layer 84 is also exposed, as shown in FIG. 9, so that P guard ring 82 is self aligned to polysilicon layer 84. Then a dopant such as boron (e.g. 1 E13 ions/cm$^2$ at 40 KeV) is implanted through the exposed insulator layer to form P guard ring 82. After the P guard ring 82 is formed, the N+ doped region 28, shown in FIG. 10, is formed according to the method described above for the first preferred embodiment.

Figure 11:
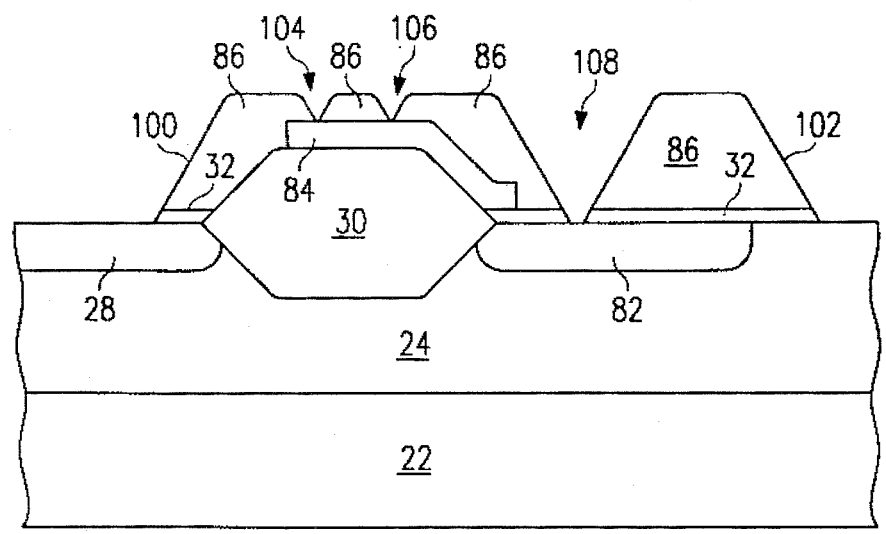

Next, a BPSG layer is formed according to the method described above for the first preferred embodiment. The BPSG layer is patterned and anisotropically etched to produce the patterned insulator 86 with angled sides 100 and 102, and contact regions 104, 106, and 108, as shown in FIG. 11. A metal layer is then deposited, patterned, and etched to provide conductive contacts 88, 90, 92, and 94, and conductive extension 93, shown in FIG. 7.

A portion of polysilicon layer 84 forms a resistor between the P guard ring 82 and the anode (conductive contact 88) of the diode. Conductive contact 92 and conductive extension 93 connect the resistive polysilicon layer 84 to conductive contact 88. Conductive contact 94 connects the P guard ring 82 to the resistive polysilicon layer 84. Conductive layer 90 is the cathode of the Schottky diode. A portion of polysilicon layer 84 overlies a portion of the insulator layer 32 so that the P guard ring 82 is self aligned to the polysilicon layer 84.

Figure 12:
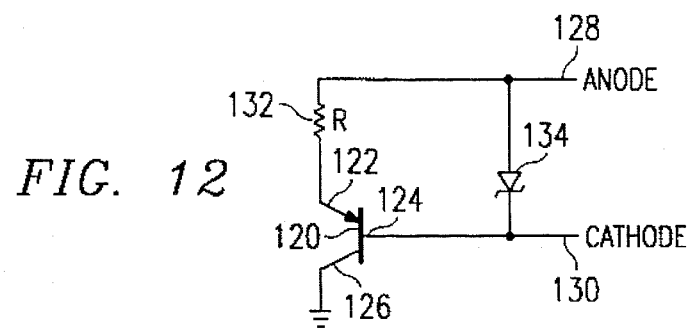
FIG. 12 is a circuit diagram of the structure in FIG. 7.

FIG. 12 is an electrical diagram of the circuit of FIG. 7. The bipolar transistor 120 shown in FIG. 12 is a parasitic vertical PNP transistor where the emitter 122 is equivalent to P guard ring 82, the base 124 is equivalent to N epitaxial layer 24, and the collector 126 is equivalent to P substrate 22. The anode 128 is equivalent to conductive layer 88. The cathode 130 is equivalent to conductive layer 90. The resistor 132 is equivalent to the portion of polysilicon layer 84 between conductive contact 92 and conductive contact 94. The diode 134 is equivalent to Schottky barrier 40.

If no current flows through the resistor 132, the structure behaves as if the P guard ring 82 were not present. When current begins to flow through resistor 132, the resistor 132 develops a voltage across it, reducing the voltage from base 124 to emitter 122 of the parasitic PNP 120 and turning off the PNP 120. This minimizes the vertical current flow. In this condition the resistor 132 acts as negative feedback for the PNP 120, limiting its gain.

The larger the resistance of the resistor 132, the lower the current. This can be taken to the limiting case of infinite resistance, or electrically floating, between the anode 128 (conductive contact 88) and the emitter 122 (P guard ring 82), which is demonstrated in the first preferred embodiment described above.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A Schottky diode circuit on a semiconductor layer comprising:
   a first conductive contact on a surface of the semiconductor layer forming a Schottky barrier at the junction of the first conductive contact and the semiconductor layer;
   a guard region in the semiconductor layer, the guard region being adjacent the Schottky barrier and separated from the first conductive contact by a portion of the semiconductor layer;
   a field insulator in the semiconductor layer, the guard region being aligned to a first edge of the field insulator;
   an insulator layer on a surface of the semiconductor layer and adjacent the field insulator;
   a resistive layer on a portion of the field insulator and on a portion of the insulator layer;
   a patterned insulator positioned over the insulator layer, over the resistive layer, and over the field insulator, and having first and second openings to the resistive layer and a third opening to the guard region;
   a second conductive contact on the patterned insulator connecting the guard region to the resistive layer;
   a third conductive contact on the patterned insulator connecting the resistive layer to the first conductive contact.

2. The circuit of claim 1, further comprising a doped region in the semiconductor layer aligned to a second edge of the field insulator.

3. The circuit of claim 2, further comprising a fourth conductive contact connected to the doped region.

4. The circuit of claim 1, wherein the resistive layer is polysilicon.

5. The circuit of claim 1, wherein the semiconductor layer is an epitaxial layer.

6. The circuit of claim 1, further comprising a semiconductor substrate, the semiconductor layer being on a surface of the semiconductor substrate.

\* \* \* \* \*